United States Patent [19]

Huynh et al.

[11] Patent Number: 5,534,790
[45] Date of Patent: Jul. 9, 1996

[54] CURRENT TRANSITION RATE CONTROL CIRCUIT

[75] Inventors: Bachvan Huynh, Fishkill, N.Y.; Charles J. Masenas, Jr., Essex Junction, Vt.

[73] Assignee: International Business Machines Corporation, Armonk, N.Y.

[21] Appl. No.: 227,162

[22] Filed: Apr. 13, 1994

[51] Int. Cl.[6] ................................................ H03K 17/16
[52] U.S. Cl. ................................ 326/27; 326/58; 326/121
[58] Field of Search ................................ 326/27, 58, 121

[56] References Cited

U.S. PATENT DOCUMENTS

| | | | |
|---|---|---|---|
| 4,593,206 | 6/1986 | Neidorff et al. | 307/270 |
| 4,704,547 | 11/1987 | Kirsch | 307/443 |
| 4,758,743 | 7/1988 | Dehganpour et al. | 307/443 |
| 4,800,298 | 1/1989 | Yu et al. | 307/443 |
| 4,894,561 | 1/1990 | Nogami | 307/443 |
| 4,906,867 | 3/1990 | Petty | 307/443 |
| 4,959,561 | 9/1990 | McDermott et al. | 307/443 |
| 4,972,101 | 11/1990 | Partovi et al. | 307/443 |
| 4,975,598 | 12/1990 | Borkar | 307/443 |
| 4,975,599 | 12/1990 | Petrovick et al. | 307/443 |
| 4,982,117 | 1/1991 | Matsuzaki et al. | 307/480 |
| 4,987,324 | 1/1991 | Wong et al. | 307/451 |
| 5,008,568 | 4/1991 | Leung et al. | 307/451 |
| 5,013,940 | 5/1991 | Ansel | 307/473 |
| 5,021,684 | 6/1991 | Ahuja | 307/443 |
| 5,038,056 | 8/1991 | Koide et al. | 307/448 |
| 5,081,374 | 1/1992 | Davis | 307/451 |
| 5,214,320 | 5/1993 | Truong | 307/443 |
| 5,220,208 | 6/1993 | Schenck | 307/443 |
| 5,315,173 | 5/1994 | Lee | 307/443 |

OTHER PUBLICATIONS

"Low L di/dt Noise Off–Chip Driver", IBM Technical Disclosure Bulletin, vol. 30, No. 9, Feb. 1988, pp. 174–176.
"High Speed CMOS Driver with Current–Diverting Circuit", IBM Technical Disclosure Bulletin, vol. 33, No. 2, Jul. 1990, pp. 334–340.

*Primary Examiner*—Edward P. Westin
*Assistant Examiner*—Andrew Sanders
*Attorney, Agent, or Firm*—Calfee, Halter & Griswold

[57] ABSTRACT

A current transition rate control circuit is provided, comprising first and second data inputs; first and second charge/discharge circuits for receiving the first and second data inputs; a first reference voltage circuit for sending a first control signal and a second reference voltage circuit for sending a second control signal to, respectively, the first and second charge/discharge circuits; and first and second output transistors coupled, respectively, to the outputs of the first and second charge/discharge circuits. The circuit controls the switching speed of the output transistors to minimize current spikes on the output. The circuit may include a pre-driver circuit for (i) receiving a single data input and outputting the first and second data inputs, and (ii) receiving a circuit disabling signal and placing the circuit in a high impedance state which turns off both of the output transistors. A test circuit is also provided for deactivating the first and second data inputs and for shutting off current flow in the first and second reference voltage circuits so that leakage current in the circuit may be measured.

11 Claims, 4 Drawing Sheets

CURRENT TRANSITION RATE CONTROL CIRCUIT

FIELD OF THE INVENTION

The present invention relates generally to electronic switching circuitry and more particularly to a current transition rate control circuit for quickly switching relatively high electrical current at the circuit output while minimizing current spiking on the output.

BACKGROUND OF THE INVENTION

Switching devices such as driver circuits are often used in electrical circuits to drive capacitive loads. The electrical current switched at the outputs of these circuits is subject to disturbances caused by the capacitance of the driven load. Inductance also plays a role in the generation of output current disturbance. In the case of driver circuits which are incorporated into integrated circuit chips and designed to drive off-circuit capacitive loads, inductances are encountered in the transmission line connecting the load to the integrated circuit, and in the on-chip wire bonding. The disturbances in the output current caused by these inductances and the capacitance of the driven load are measured in terms of a change in output current with respect to time (di/dt).

The capacitance of an off-chip load is typically much higher than that encountered on-chip, and its value is often unknown. Thus large, low impedance drivers are required to drive such unknown, and potentially large, capacitive loads. For example, the capacitive load of an off-chip device may be only on the order of 5–10 picofarads or it can be up to around 200 picofarads. High speed devices for driving such loads are desired for obvious reasons, but faster switching speeds come at the expense of instantaneous changes in current in the output, manifested in the form of current spiking (increased di/dt). Rapid turn on and turn off of high speed, large drivers often result in unacceptably large di/dt disturbances.

Thus, it is an object of the present invention to provide a low impedance current transition rate control circuit which controls the rate at which the output current switches state, so as to prevent excessive current spiking on the output, by providing a novel slew control circuit which controls the turn on of large driving devices in CMOS off-chip driver (OCD) circuitry. It is a further object of the present invention to provide such a device in a circuit which consumes little DC power, requires little on-chip space, and is effective in regulating di/dt at its output, and which is immune to effects of random process variations on output driver noise and circuit delay.

SUMMARY OF THE INVENTION

A switching mechanism is provided, in the form of a current transition rate control circuit. The transition rate control circuit comprises first and second data inputs; first and second charge/discharge circuits for receiving the first and second data inputs; a first reference voltage circuit for sending a first control signal and a second reference voltage circuit for sending a second control signal to, respectively, the first and second charge/discharge circuits; and first and second output transistors coupled, respectively, to the outputs of the first and second charge/discharge circuits. These individual circuits which make up the transition rate control circuit are comprised entirely of field effect transistors (FETs). The transition rate control circuit is implemented on an integrated circuit chip, and is designed to drive an off-chip capacitive load.

The circuit controls the switching speed of the output transistors to minimize current spikes on the circuit output. The circuit permits the output to (i) switch from low to high by quickly turning off the second output transistor, and turning on the first output transistor in a controlled manner to minimize the spike in the current on the circuit output, and (ii) switch from high to low by quickly turning off the first transistor, and turning on the second transistor in a controlled manner to minimize the spike in the output current.

The control mechanism which controls the speed at which the output transistors are turned on during the switching process comprises control transistors in each of the first and second charge/discharge circuits which receive control signals, respectively, from the first and second reference voltage circuits. Current at the gates of the first and second output transistors is discharged through the control transistors, respectively, in the first and second charge/discharge circuits. The addition of the control transistor as a discharging element in these charge/discharge circuits slows the turn on process of the first and second output transistors. The slowed turn on process results in an acceptable di/dt on the circuit output.

The first and second reference voltage circuits, however, do not operate to slow down the turning off of either of the output transistors. The turning off operations need to be accomplished as quickly as possible so that both of the output transistors are not ON simultaneously, which would result in partial conduction of both transistors, causing shunt currents which would aggravate the di/dt effect on the power supply ($V_{dd}$ and ground (GND)). Normally, the circuit output current comes from the power supply ($V_{dd}$ or GND), so the supply current and the output current are equal (output current=$V_{dd}$ current or GND current). However, in the case of shunt currents, $V_{dd}$ current=GND current and the output current is around zero.

The circuit may include a pre-driver circuit for (i) receiving a single data input and outputting the first and second data inputs, and (ii) receiving a circuit disabling signal and placing the circuit in a high impedance state which turns off both of the output transistors. A test circuit is also provided for deactivating the first and second data inputs and for shutting off current flow in the first and second reference voltage circuits so that leakage current in the circuit may be measured.

DETAILED DESCRIPTION OF THE PREFERRED EMBODIMENT

Figure 1:
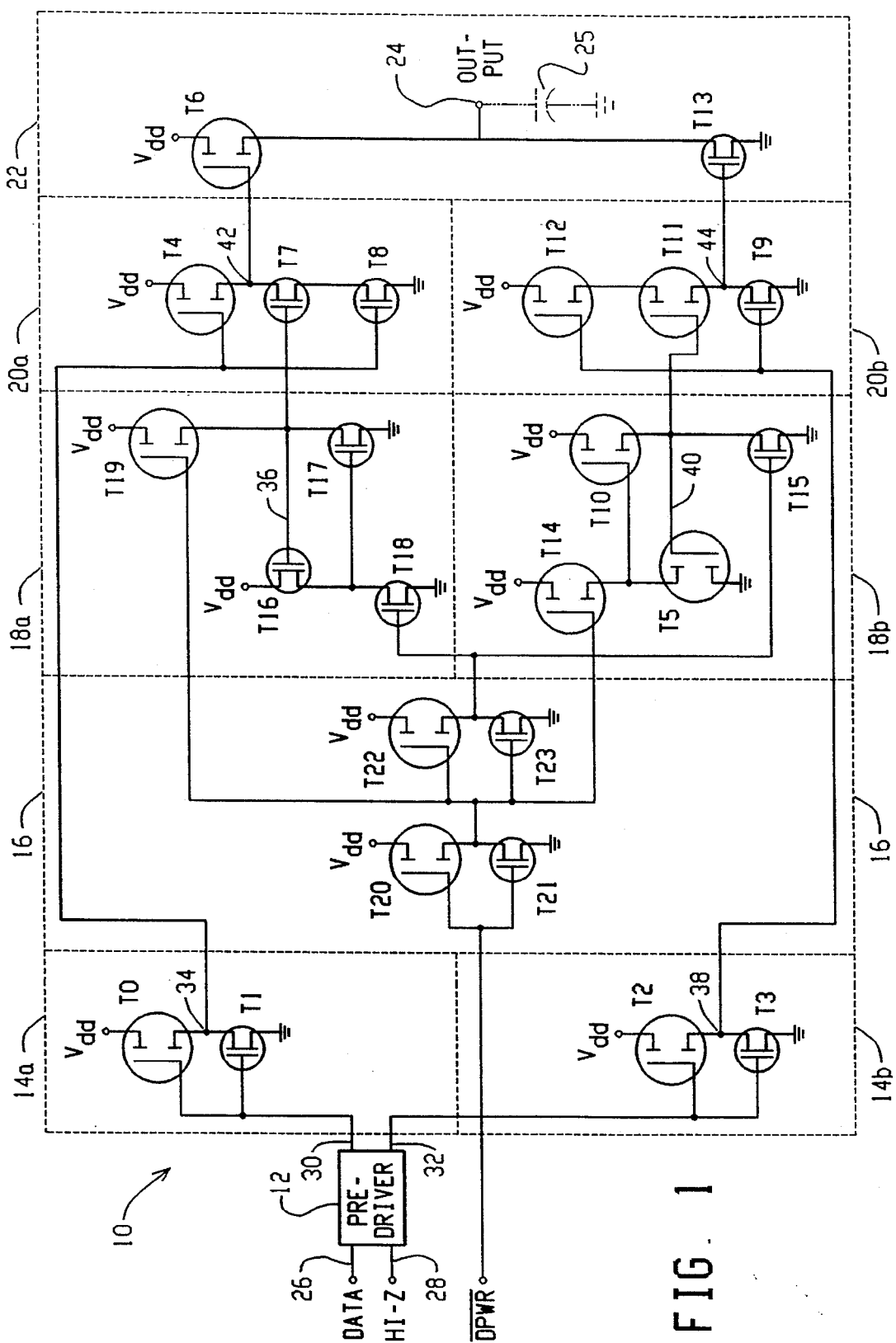
FIG. 1 is a schematic diagram of a circuit embodiment of a current transition rate control mechanism constructed according to the principles of the present invention.

A schematic diagram of a circuit 10 embodiment of the current transition rate control mechanism of the present invention is shown in FIG. 1. The circuit 10 comprises a pre-driver circuit 12, buffer circuits 14a and 14b, a test circuit 16, reference voltage circuits 18a and 18b, charge/discharge circuits 20a and 20b, and an output circuit 22. The circuits 14a–16b, 18a–b, 20a–b and 22 are comprised entirely of field effect transistors (FETs). Transistors T0, T2, T4, T5, T6, T10, T11, T12, T14, T19, T20 and T22 are p-type FETs (PFETs) and transistors T1, T3, T7, T8, T9, T13, T15, T16, T17, T18, T21 and T23 are n-type FETs (NFETs). A supply voltage $V_{dd}$ is provided for some of the FETs as shown in FIG. 1. The design of the circuit 10 controls the switching speed of output transistors T6 and T13 to minimize current spiking on circuit output 24. A capacitor 25 (shown in phantom in FIG. 1) represents a capacitive load on circuit output 24. In the preferred embodiment, the circuit 10 is implemented on an integrated circuit chip, and the capacitive load 25 represents an off-chip device to be driven.

Data and HI-Z inputs 26 and 28, respectively, drive the pre-driver circuit 12. Outputs 30 and 32 of the pre-driver circuit 12 drive the inputs to buffer circuits 14a and 14b, respectively. Output 34 of buffer circuit 14a and output 36 of reference voltage circuit 18a drive the input of charge/discharge circuit 20a ; and output 38 of buffer circuit 14b and output 40 of reference voltage circuit 18b drive the input of charge/discharge circuit 20b. Output 42 of charge/discharge circuit 20a drives output transistor T6 and output 44 of charge/discharge circuit 20b drives output transistor T13. A de-power (DPWR) input 46 is used as a test input to test circuit 16, although the test circuit 16 is not used during the normal switching operation of the circuit 10.

The circuit output 24 is switched by the circuit 10 between logical high (charged) and low (discharged) states, generally between 0-$V_{dd}$. As used herein, "charge" means a logical low to high transition, and "discharge" means a logical high to low transition. When the circuit output 24 is low, output transistor T13 is ON and output transistor T6 is OFF, and when the circuit output 24 is high, output transistor T13 is OFF and output transistor T6 is ON. The circuit 10 permits the output 24 to (i) switch from low to high by quickly turning off transistor T13, and turning on transistor T6 in a controlled manner to minimize the spike in the current on the circuit output 24, and (ii) switch from high to low by quickly turning off transistor T6, and turning on transistor T13 in a controlled manner to minimize the spike in the output current.

Ignoring for the moment the test circuit 16, the operation of the circuit 10 during the low to high transition of the circuit output 24 (charging the output) is as follows. This non-test mode of operation assumes that test circuit 16 is out of circuit 10 and that the gates of transistors T15 and T18 are effectively tied to $V_{dd}$ and that the gates of transistors T19 and T14 are effectively tied to ground. The data signal 26 input to the pre-driver circuit 12, which is in the form of a logical data stream, initiates the switching operation of the circuit 10. The pre-driver circuit 12 acts as a buffer and splits the data signal into output signals 30 and 32, which are in phase, and in an opposite logical state as that of the circuit output 24. For example, if the circuit output 24 is being changed from a logical low state to a logical high state (charging), the in-phase outputs 30 and 32 of the pre-driver 12 would both change from a logical high state to a logical low state. The construction of the pre-driver circuit 12 is typical of pre-drivers known in the art and will therefore not be described in any further detail herein.

With outputs 30 and 32 of the pre-driver circuit 12 in a low logic state, the outputs 34 and 38 of buffer circuits 14a and 14b, respectively, are forced high. (Inversion occurs because PFET T0 and NFET T1 are configured as an inverter stage, and PFET T2 and NFET T3 are similarly configured.) The high output signal 34 of buffer circuit 14a serves as a control signal to turn off PFET T4 and turn on NFET T8, thereby turning on NFET control transistor T7 and output transistor PFET T6. Because T6 is a PFET, T6 is turned on by discharging the gate of T6 (output 42 of charge/discharge circuit 20a) through transistors T7 and T8.

With respect to charge/discharge circuit 20b, the high output signal 38 of buffer circuit 14b serves as a control signal to turn off PFET T12 and control transistor PFET T11 and turn on NFET T9, thereby turning off output transistor NFET T13. Because T13 is an NFET, T13 is turned off by discharging the gate of T13 (output 44 of charge/discharge circuit 20b) through T9. Because transistor T7 is added in series with transistor T8 in charge/discharge circuit 20a, the discharge of the gate of T6 to turn T6 on occurs slower than the discharge of the gate of T13 to turn T13 off, because while T13 discharges only through transistor T9, T6 discharges through both T7 and T8. This relatively slow turn on of T6 results in an acceptable di/dt on the circuit output 24 as the output is charging. With transistor T6 ON and transistor T13 OFF, the circuit output 24 is driven high by the drain to source current provided by $V_{dd}$ through transistor T6.

During normal non-test operation of the circuit 10, transistors T18 and T19 are fully on. T19 may be viewed from a circuit standpoint as a current source and T18 as an impedance element. Transistor T16, configured as a source follower, feeds the drain voltage of active transistor T17 back to its gate. This feedback path lowers the output impedance of the reference voltage circuit 18a. Accordingly, the source to drain voltage of transistor T17 is twice its threshold voltage $V_t$, or $2 \times V_t$ (assuming equal thresholds for T16 and T17, which is a readily attainable parameter for on-chip devices). This $2 \times V_t$ voltage is used as the reference voltage to drive the gate of control transistor T7. During the time when the gate of T6 is being discharged, transistor T7 is provided with $V_t$ of overdrive (assuming that the threshold of T7 equals that of T16 and T17).

The operation of the circuit 10 during the high to low transition of the circuit output 24 (discharging the output) during a non-test mode proceeds as follows. The data signal 26 input to the pre-driver circuit 12 again initiates the switching operation of the circuit 10. The in-phase output signals 30 and 32 of pre-driver circuit 12 both change from a logical low state to a logical high state.

With outputs 30 and 32 of the pre-driver circuit 12 in a high logic state, the outputs 34 and 38 of buffer circuits 14a and 14b, respectively, are forced low. The low output signal 34 of buffer circuit 14a turns on PFET T4 and turns off NFET T8, thereby turning off both NFET T7 and output transistor PFET T6. Because T6 is a PFET, T6 is turned off by charging the gate of T6 (output 42 of charge/discharge circuit 20a) through transistor T4.

With respect to charge/discharge circuit 20b, the high output signal 38 of buffer circuit 14b turns on PFETs T12 and T11 and turns off NFET T9, thereby turning on output transistor NFET T13. Because T13 is an NFET, T13 is turned on by charging the gate of T13 (output 44 of charge/discharge circuit 20b) through transistors T11 and T12. Because transistor T11 is added in series with transistor T12 in charge/discharge circuit 20b, the charge of the gate of T13 to turn T13 on occurs slower than the charge of the gate of T6 to turn T6 off, because while T6 charges only through transistor T4, T13 charges through both T11 and T12. This relatively slow turn on of T13 results in an acceptable di/dt on the circuit output 24 as the output is discharging. With transistor T6 OFF and transistor T13 ON, the circuit output 24 is driven low by T13 conducting the charge on circuit output 24 to ground.

The configuration of reference voltage circuit 18b is similar to that of reference voltage circuit 18a. During normal non-test operation of the circuit 10, transistors T14 and T15 are fully on. T15 may be viewed from a circuit standpoint as a current source and T14 as an impedance element. Transistor T5, configured as a source follower, feeds the drain voltage of active transistor T10 back to its gate. This feedback path lowers the output impedance of the reference voltage circuit 18b. Accordingly, the source to drain voltage of transistor T10 is twice its threshold voltage $V_t$, or $2 \times V_t$ (assuming equal thresholds for T10 and T5, which is a readily attainable parameter for on-chip devices). This $2 \times V_t$ voltage is used as the reference voltage to drive the gate of control transistor T11. During the time when the gate of T13 is being charged, transistor T11 is provided with $V_t$ of overdrive (assuming that the threshold of T11 equals that of T10 and T5).

Thus, reference voltage circuit 18a is used during normal operation to slow the turn on of T6 to charge the circuit output 24, and reference voltage circuit 18b is used to slow the turn on of T13 to discharge the circuit output 24. In this manner, switching of the circuit output 24 results is accomplished without any unacceptably adverse di/dt effects on the output 24. The reference voltage circuits 18a and 18b, however, do not operate to slow down the turning off of either T6 or T13. The turning off operations need to be accomplished as quickly as possible so that T13 and T6 are not ON simultaneously, which would result in partial conduction of both transistors, causing shunt currents which would aggravate the di/dt effect on the power supply ($V_{dd}$ and GND).

During the non-test mode of operation, the DPWR signal is inactive high, so that the tied outputs of T20 and T21 are low (and fed to the gates of T19 and T14) and the tied outputs of T22 and T23 are high (and fed to the gates of T15 and T18). In this non-test mode of operation, transistors T16, T17, T18 and T19 of voltage reference circuit 18a and transistors T5, T10, T14 and T15 of voltage reference circuit 18b are all conducting current. During the test mode of operation, however, this current must be cut off in order to detect any drain current leaks in the circuit sourced by $V_{dd}$. A zero current or quiescent state is induced by activating (setting low) the DPWR input and deactivating the data input 26. This effectively shuts off transistors T18 and T19 (and hence T16 and T17) in voltage reference circuit 18a and transistors T14 and T15 (and hence T5 and T10) in voltage reference circuit 18b. Any drain current measured from $V_{dd}$ during the test mode, then, is leakage current. The integrated circuit chip on which circuit 10 is implemented may be accepted or rejected based on this current measurement.

A plurality of circuits 10 (typically between 100 and 200) may reside on a single integrated circuit chip. More than one of the circuits 10 is often coupled to the same capacitive load 25. Accordingly, during normal operation only one of the circuits 10 drives the load 25 while the other outputs of the circuits which share the same output line are neither driven high nor low but are instead left floating. In such a case, the output 24 of only one of the circuits 10 would be active at any time to be responsible for switching current to the load. The remaining circuits would effectively be inactivated by activating the HI-Z line, neither sinking nor sourcing current on the output line.

The HI-Z input 28 is used for this purpose. The HI-Z is a high impedance input to the pre-driver circuit 12 which places the circuit 10 into a high impedance state so as to disable the circuit and turn off both of the output transistors T6 and T13. With the HI-Z input active, the gates to transistors T6 and T13 are not in phase, with the gate to transistor at $V_{dd}$ and the gate to transistor 13 at ground. Thus both T6 and T13 are OFF in the high impedance mode of operation.

Figure 2:
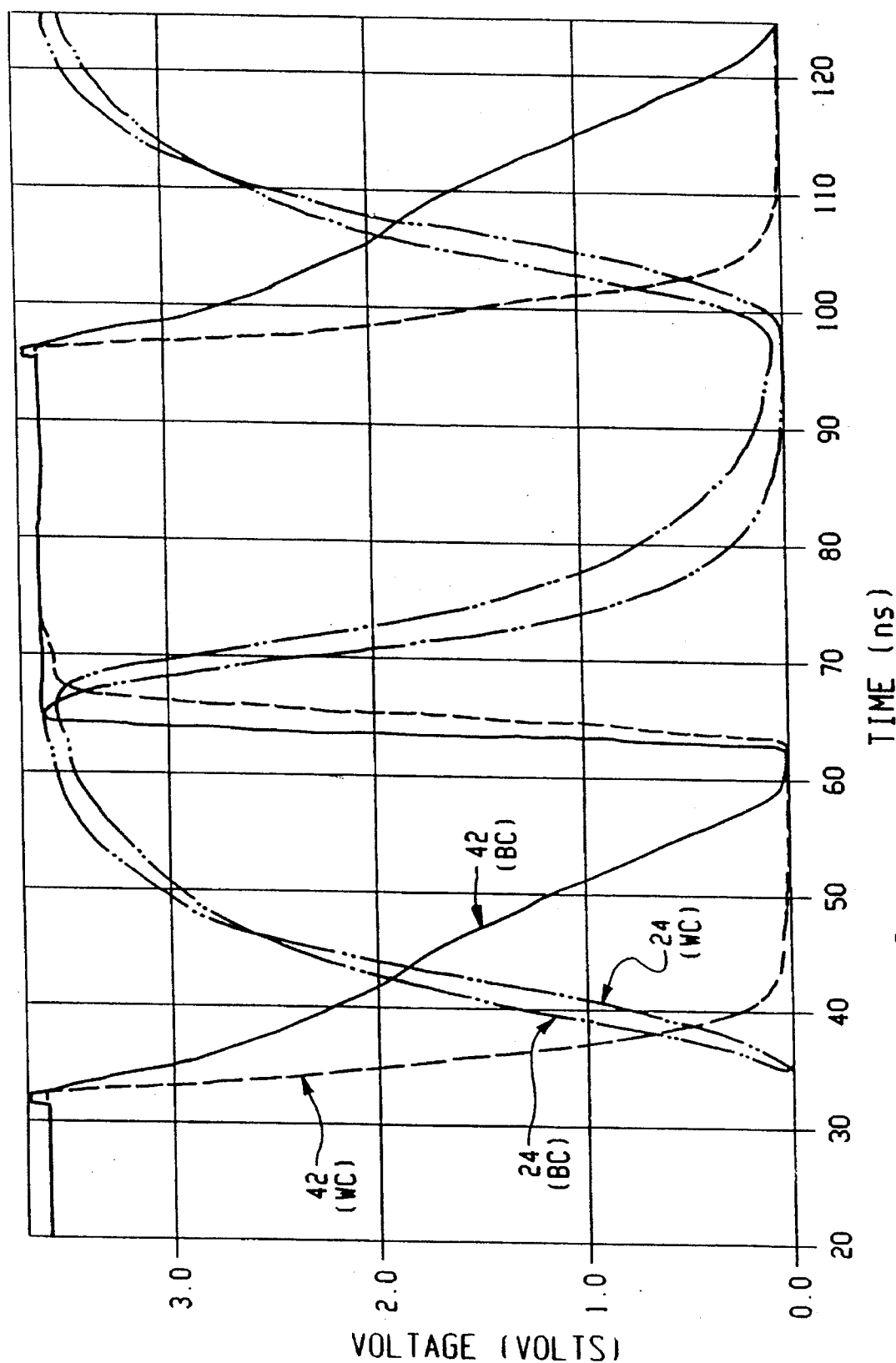
FIG. 2 is a graphical representation of the gate voltage waveform of a first output transistor of the circuit of FIG. 1, superimposed over the corresponding circuit output waveform.
Figure 3:
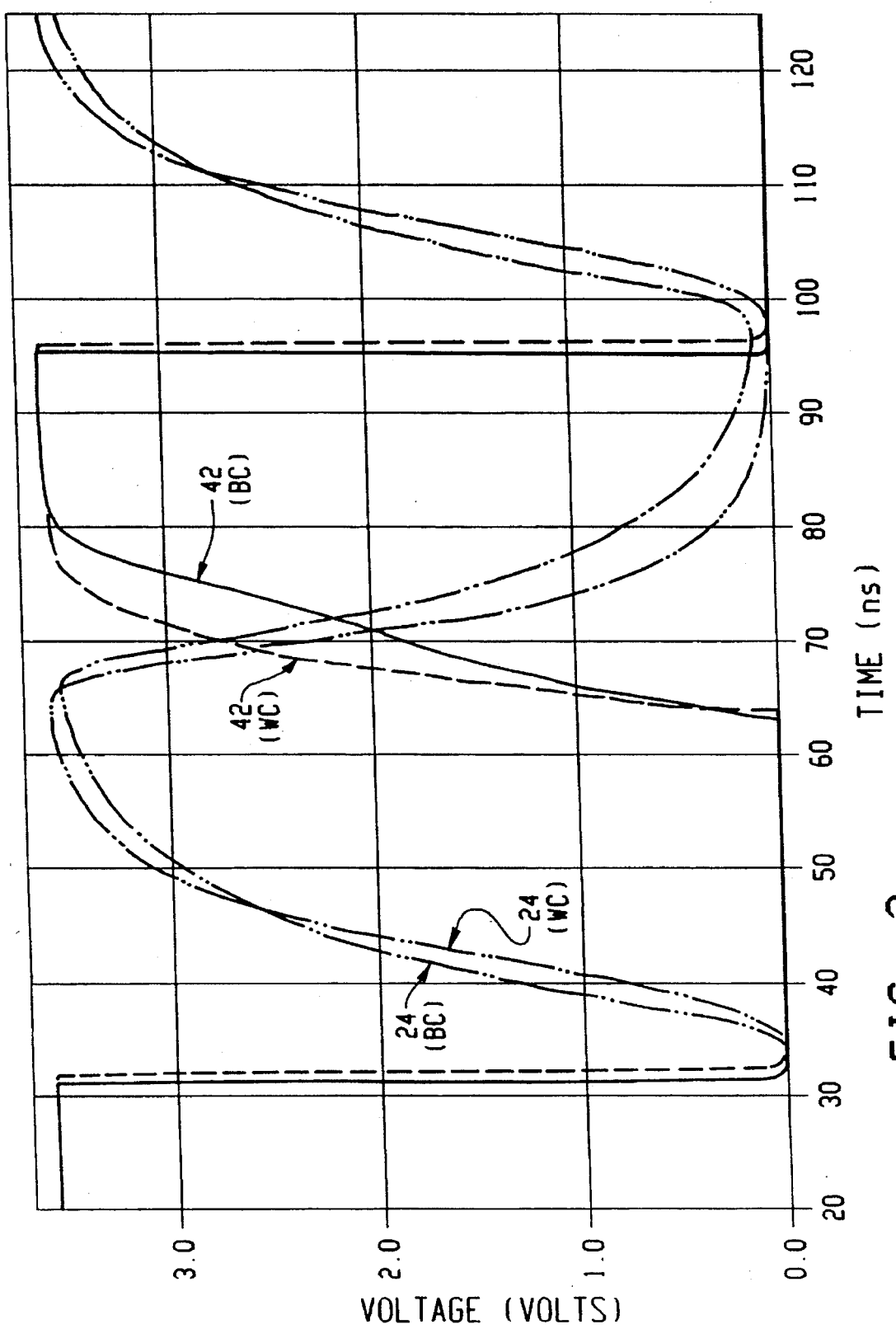
FIG. 3 is a graphical representation of the gate voltage waveform of a second output transistor of the circuit of FIG. 1, superimposed over the corresponding circuit output waveform.

FIGS. 2 and 3 are graphical representations of the gate voltage waveforms, respectively, of the gate of output transistor T6 and the gate of output transistor T13 of the circuit of FIG. 1, superimposed over the circuit output 24 waveform. In these Figures, the vertical axis of the graph represents voltage in volts, the horizontal axis represents time in nanoseconds, the capacitive load 25 of FIG. 1 is taken as 100 picofarad, and $V_{dd}$ is assumed to be 3.6 VDC.

As shown in FIG. 2, the best case ("BC") and worst case ("WC") scenarios are illustrated for the output 42 of charge/discharge circuit 18a, wherein the best case represents the slowest turn on of transistor T6 and the worst case represents the fastest turn on of transistor T6. The corresponding waveforms for the circuit output 24 are also shown for these best and worst cases. The waveforms of FIG. 2 are very atypical of CMOS circuits. The worst case for a typical CMOS circuit refers to the process condition which corresponds to the greatest circuit delay. Thus, the worst case scenario for a typical uncompensated CMOS circuit would be expected to produce the longest delay, unlike the compensated circuit of the present invention wherein the worst case delay is much faster than the normal best case. This type of circuit response allows for compensation for random process variations on circuit delay.

Similar to FIG. 2, FIG. 3 shows the best case ("BC") and worst case ("WC") scenarios for the output 44 of charge/discharge circuit 18b, wherein the best case represents the slowest turn on of transistor T13 and the worst case represents the fastest turn on of transistor T13. The corresponding waveforms for the circuit output 24 are also shown for these best and worst cases.

In FIGS. 2 and 3, the worst case DC power which is contributed to the total circuit power by the reference voltage circuits 18a and 18b is less than 0.5 milliwatt per output transistor T6 and T13. In operation of the circuit 10, this reference voltage circuitry may contribute to a net power loss by eliminating overlap current through the T6 and T13, caused by the simultaneous conduction of these two transistors as described above.

Figure 4:
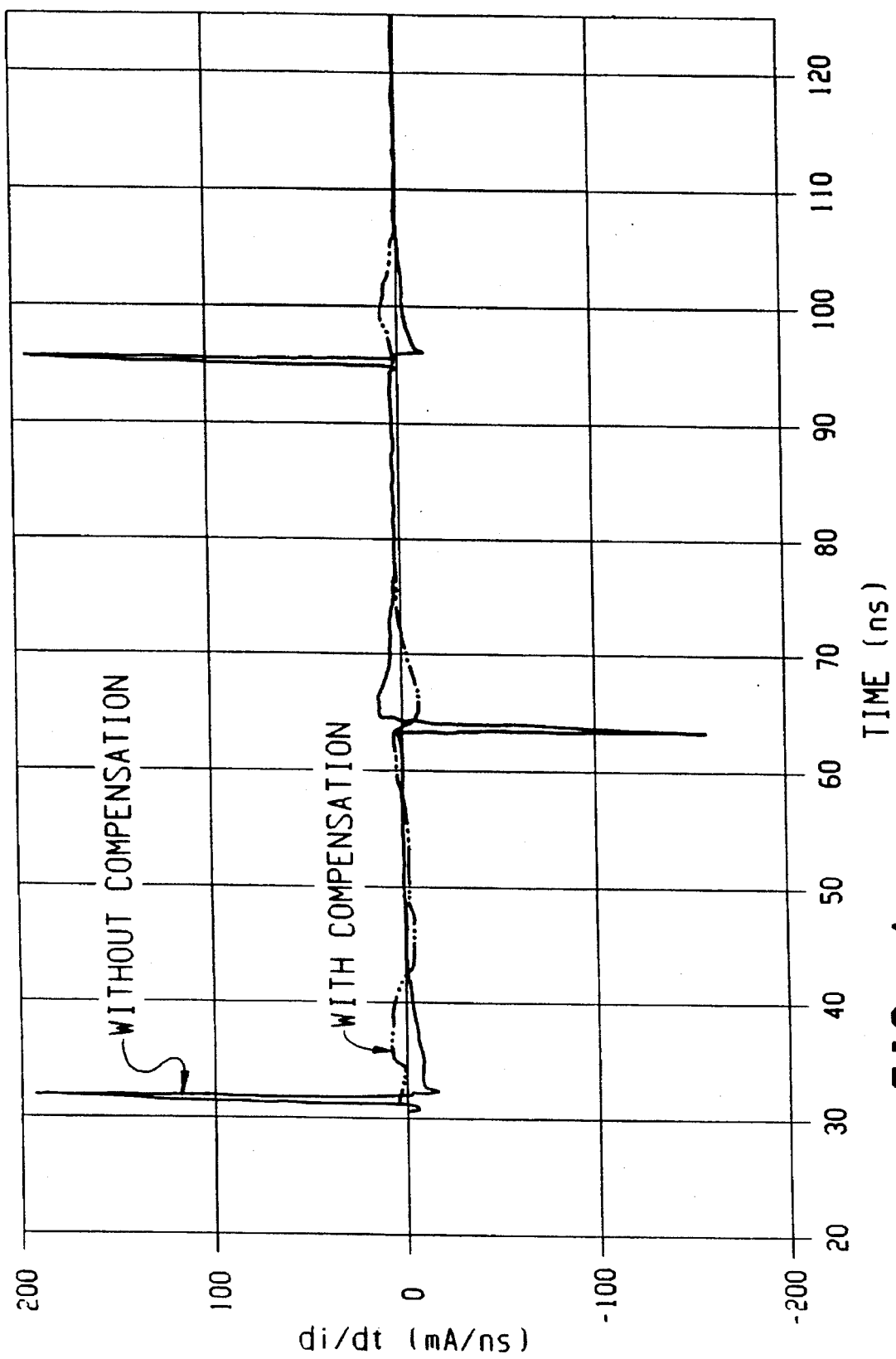
FIG. 4 is a graphical representation of the di/dt waveform of the output of the circuit of FIG. 1.

FIG. 4 is a graphical representation of the di/dt waveform of the output of the circuit 10 of FIG. 1. In this Figure, the vertical axis of the graph represents di/dt (in milliamps per nanoseconds), the horizontal axis represents time in nanoseconds, the capacitive load 25 of FIG. 1 is taken as 100 picofarad, and $V_{dd}$ is assumed to be 3.6 VDC. The solid line represents the di/dt waveform of the output of the circuit 10 without compensation provided by the reference voltage circuits 18a and 18b, and the dashed line represents the di/dt waveform of the output of the circuit 10 with compensation provided by the reference voltage circuits 18a and 18b. As shown in FIG. 4, the compensation provided by these reference voltage circuits of the current rate control circuit 10 of FIG. 1 result in considerably less current spiking on the circuit output 24.

Accordingly, the preferred embodiment of current transition rate control mechanism has been described. With the foregoing description in mind, however, it is understood that this description is made only by way of example, that the invention is not limited to the particular embodiments described herein, and that various rearrangements, modifications and substitutions may be implemented without departing from the true spirit of the invention as hereinafter claimed.

We claim:

1. A current transition rate control circuit, comprising:

first and second data inputs;

a first charge/discharge circuit for receiving said first data input, said first charge/discharge circuit comprising a switching pair of transistors and an NFET control transistor coupled in series with said switching pair of transistors, said first charge/discharge circuit further having a first output line;

a second charge/discharge circuit for receiving said second data input, said second charge/discharge circuit comprising a switching pair of transistors and a PFET control transistor coupled in series with said switching pair of transistors, said second charge/discharge circuit further having a second output line;

a first reference voltage circuit for sending a first control signal and a second reference voltage circuit for sending a second control signal to, respectively, said control transistors in said first and second charge/discharge circuits;

a first output PFET transistor coupled to said first output line of said first charge/discharge circuit, said gate of said first output transistor being directly coupled to said drain of said control transistor for said first charge/discharge circuit;

a second output NFET transistor coupled to said second output line of said second charge/discharge circuit, said gate of said second output transistor being directly coupled to the source of said control transistor for said second charge/discharge circuit; and a test circuit for shutting off current flow in said first and second reference voltage circuits so that leakage current in said circuit may be measured.

2. A current transition rate control circuit, comprising:

first and second data inputs;

a first charge/discharge circuit for receiving said first data input, said first charge/discharge circuit comprising a switching pair of transistors and an NFET control transistor coupled in series with said switching pair of transistors, said first charge/discharge circuit further having a first output line;

a second charge/discharge circuit for receiving said second data input, said second charge/discharge circuit comprising a switching pair of transistors and a PFET control transistor coupled in series with said switching pair of transistors, said second charge/discharge circuit further having a second output line;

a first reference voltage circuit for sending a first control signal to said NFET control transistor in said first charge/discharge circuit, said first reference voltage circuit comprising (i) a first current source, (ii) a first output driver transistor connected to said first current source for driving said NFET control transistor, (iii) a first impedance element connected to said first output driver transistor, and (iv) a first source follower transistor connected in a feedback path to said first output driver transistor;

a second reference voltage circuit for sending a second control signal to said PFET control transistor in said second charge/discharge circuit, said second reference voltage circuit comprising (i) a second current source, (ii) a second output driver transistor connected to said second current source for driving said PFET control transistor, (iii) a second impedance element connected to said second output driver transistor, and (iv) a second source follower transistor connected in a feedback path to said second output driver transistor;

a first output PFET transistor coupled to said first output line of said first charge/discharge circuit, said gate of said first output transistor being directly coupled to said drain of said control transistor for said first charge/discharge circuit; and a second output NFET transistor coupled to said second output line of said second charge/discharge circuit, said gate of said second output transistor being directly coupled to the source of said control transistor for said second charge/discharge circuit.

3. A current transition rate control circuit, comprising:

first and second data inputs;

first and second charge/discharge circuits for receiving said first and second data inputs, respectively, each of said first and second charge/discharge circuits comprising a switching pair of transistors and a control transistor coupled in series with said switching pair of transistors, said control transistor for said first charge/discharge circuit being an NFET and said control transistor for said second charge/discharge circuit being an PFET, each of said first and second charge/discharge circuits further having an output line;

a first reference voltage circuit for sending a first control signal and a second reference voltage circuit for sending a second control signal to, respectively, said control transistors in said first and second charge/discharge circuits; and first and second output transistors coupled, respectively, to said output lines of said first and second charge/discharge circuits, said first output transistor being a PFET and said second output transistor being an NFET, each of said first and second output transistors and each of said first and second charge/discharge circuit control transistors having a gate, a source and a drain, wherein said gate of said first output transistor is directly coupled to said drain of said control transistor for said first charge/discharge circuit and said gate of said second output transistor is directly coupled to the source of said control transistor for said second charge/discharge circuit.

4. The circuit of claim 3, wherein the drain of said first output transistor is coupled to the drain of said second output transistor to provide an output signal terminal for said circuit, and wherein the logic level of a signal provided at said output signal terminal is opposite the logic level of a signal present on said output lines of said first and second charge/discharge circuits.

5. The circuit of claim 3, further comprising a pre-driver circuit for receiving a single data input and for outputting said first and second data inputs.

6. The circuit of claims 5, wherein said pre-driver circuit outputs said first and second data inputs in phase with each other.

7. The circuit of claim 5, wherein said pre-driver circuit further comprises an input for receiving a circuit disabling signal and circuitry for placing the circuit in a high impedance state which turns off both of said output transistors.

8. The circuit of claim 3, further comprising first and second inverter circuits for inverting said first and second data inputs prior to said first and second charge/discharge circuits receiving said first and second data inputs.

9. The circuit of claim 8, wherein each of said first and second inverter circuits comprises an NFET-PFET pair of transistors.

10. The circuit of claim 1, wherein said test circuit comprises a test input and two NFET-PFET inverter pairs of transistors.

11. The circuit of claim 2, wherein said first and second current sources and said first and second impedance elements are both transistors.

* * * * *